(12) United States Patent
Ohtsuka et al.

(10) Patent No.: US 6,746,957 B2
(45) Date of Patent: Jun. 8, 2004

(54) MANUFACTURE OF SEMICONDUCTOR DEVICE WITH COPPER WIRING

(75) Inventors: Nobuyuki Ohtsuka, Kawasaki (JP); Noriyoshi Shimizu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/811,525

(22) Filed: Mar. 20, 2001

(65) Prior Publication Data

US 2002/0019131 A1 Feb. 14, 2002

(30) Foreign Application Priority Data

Aug. 10, 2000 (JP) ..................................... 2000-242816

(51) Int. Cl.[7] ............................................. H01L 21/44
(52) U.S. Cl. ..................... 438/687; 438/637; 438/676; 438/680
(58) Field of Search ..................... 438/687, 637–640, 438/672, 674–676, 680

(56) References Cited

U.S. PATENT DOCUMENTS

| | | | | |
|---|---|---|---|---|
| 4,948,623 A | * | 8/1990 | Beach et al. | 427/140 |
| 5,084,412 A | * | 1/1992 | Nakasaki | 148/DIG. 35 |
| 5,093,710 A | * | 3/1992 | Higuchi | 257/764 |
| 5,393,577 A | * | 2/1995 | Uesugi et al. | 216/41 |
| 5,736,002 A | * | 4/1998 | Allen et al. | 438/704 |
| 5,815,396 A | * | 9/1998 | Shimamura et al. | 700/123 |
| 5,953,634 A | * | 9/1999 | Kajita et al. | 438/635 |
| 6,087,257 A | * | 7/2000 | Park et al. | 438/675 |
| 6,090,699 A | * | 7/2000 | Aoyama et al. | 438/622 |
| 6,265,310 B1 | * | 7/2001 | Hoshino | 438/641 |
| 6,506,675 B1 | * | 1/2003 | Oomiya et al. | 438/677 |

FOREIGN PATENT DOCUMENTS

EP     0135179     * 3/1985 ........... C23C/16/18

* cited by examiner

*Primary Examiner*—Thanh Nguyen
(74) *Attorney, Agent, or Firm*—Armstrong, Kratz, Quintos, Hanson & Brooks, LLP

(57) ABSTRACT

A method of manufacturing a semiconductor device including the steps of: (a) preparing a semiconductor substrate formed with an insulating layer having a wiring recess; and (b) forming a conductive layer by chemical vapor deposition on a surface of the semiconductor substrate including an inner surface of the wiring recess, while lamp light is applied to the semiconductor substrate, the conductive layer being substantially made of copper. With this method, Cu wiring having a high adhesion force is formed by chemical vapor deposition.

33 Claims, 4 Drawing Sheets

$(CH_3)_3 SiCH=CH_2$

MANUFACTURE OF SEMICONDUCTOR DEVICE WITH COPPER WIRING

This application is based and claims priority on Japanese Patent Application 2000-242816, filed on Aug. 10, 2000, the entire contents of which are incorporated herein by reference.

BACKGROUND OF THE INVENTION a) Field of the Invention

The present invention relates to a semiconductor device and its manufacture method, and more particularly to a semiconductor device with copper wiring and its manufacture method.

In this specification, wiring made of copper or copper alloy consisting essentially of copper is called copper wiring. Copper wiring is intended to be inclusive of copper wiring with a barrier layer.

b) Description of the Related Art

Demands for high integration of semiconductor integrated circuits are high. Fine circuit elements such as active elements as well as fine wiring are therefore required. For fine wiring, in place of Al conventionally used as wiring material, attention has been paid to Cu which has a lower resistance and a higher tolerance of electromigration (EM).

Cu is difficult to be worked for fine patterning. Namely, it is difficult to form a wiring line by forming a wiring layer and a mask such as resist on the wiring layer, and finely etching it, as opposed to Al wiring. In place of this method, a damascene process is performed for Cu wiring. With this process, a wiring trench is formed in an insulating layer, a Cu layer is embedded in the trench by plating or the like, and then an unnecessary Cu layer on the insulating layer is removed by chemical mechanical polishing (CMP) or the like.

In a multi-layer wiring structure, a via conductor interconnecting wiring levels is required. A single damascene process and a dual damascene process are known. With the single damascene process, a via conductor and wiring are formed by different damascene processes, and with the dual damascene process, a via conductor and wiring are formed at the same time. From the viewpoint of process simplification, the dual damascene process is more effective.

Cu has the nature that it diffuses into an insulating layer and degrades the insulation characteristics. In order to prevent Cu diffusion into an insulating layer, it is desired to form a barrier layer as an underlying layer. When a Cu layer is formed as a main wiring layer, electroplating is often used. It is desired to form a conductive seed layer for electroplating.

A barrier layer has been formed by sputtering metal nitride such as TaN and TiN. Although this barrier layer is electrically conductive, if this layer is used as a seed layer, the efficiency of electroplating cannot be made high because this layer has a high resistance. From this reason, a Cu layer formed by sputtering has been used as a seed layer.

As the degree of scaling-down proceeds, there is a tendency that the aspect ratio of a recess such as a via hole and a wiring trench becomes high. It is not easy to uniformly form a metal film through sputtering in a recess having a high aspect ration. The higher aspect ratio becomes, the more difficult it becomes to uniformly form a metal film on the side wall of a recess.

Chemical vapor deposition (CVD) is now becoming popular as a method of forming a uniform film in the recess having a high aspect ration. A barrier layer capable of being formed by CVD may be a TiN layer, a WN layer, a ZrN layer, a TaN layer of the like. Reports on CVD growth of TiN layer and ZrN layer have been given already. As a seed layer capable of being formed by CVD, A Cu layer has been reported which uses copper (1) trimethylvinylsilylhexafluoroacethylacetonato (Cu (hfac) tmve) or the like as source material.

Although it is desired to form the barrier layer and seed layer for Cu wiring by CVD, this technology has not been established yet.

SUMMARY OF THE INVENTION

It is an object of the present invention to provide a Cu wiring manufacturing method suitable for fine patterning.

It is another object of the invention to provide a semiconductor device manufacturing method in which high purity Cu wiring is formed by CVD.

It is another object of the invention to provide a semiconductor device manufacturing method in which Cu wiring having high adhesion force is formed by CVD.

It is another object of the invention to provide a semiconductor device having Cu wiring formed by CVD and being less peeled off.

According to one aspect of the present invention, there is provided a method of manufacturing a semiconductor device comprising the steps of: (a) preparing a semiconductor substrate formed with an insulating layer having a wiring recess; and (b) forming a conductive layer by chemical vapor deposition on a surface of the semiconductor substrate including an inner surface of the wiring recess, while lamp light is applied to the semiconductor substrate, the conductive layer consisting essentially of copper.

With this method, a Cu layer having a low impurity concentration can be formed.

A semiconductor device having high reliability Cu wiring can be formed.

DETAILED DESCRIPTION OF THE PREFERRED EMBODIMENTS

The present inventors first formed barrier layers and seed layers by CVD according to conventional techniques.

Figure 4A:
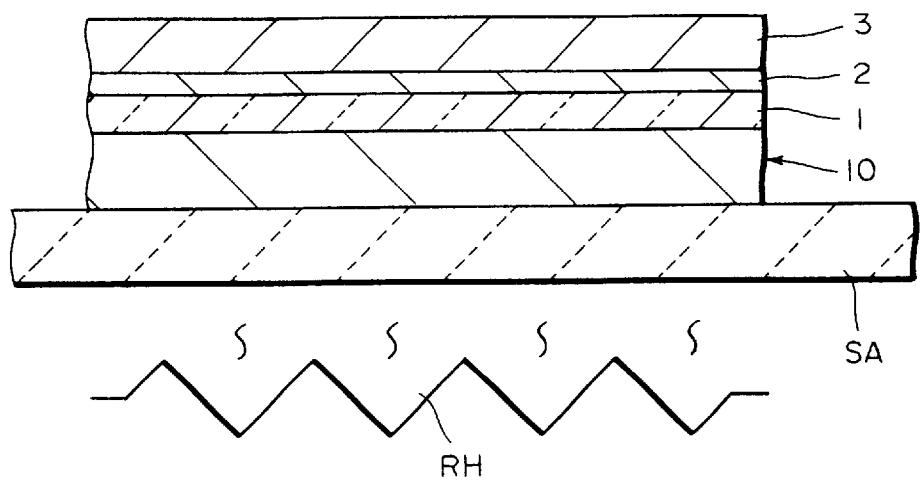
FIGS. 4A and 4B are a cross sectional view illustrating a Cu film forming process by resistance heating CVD and a graph showing the characteristics of samples.
Figure 4B:
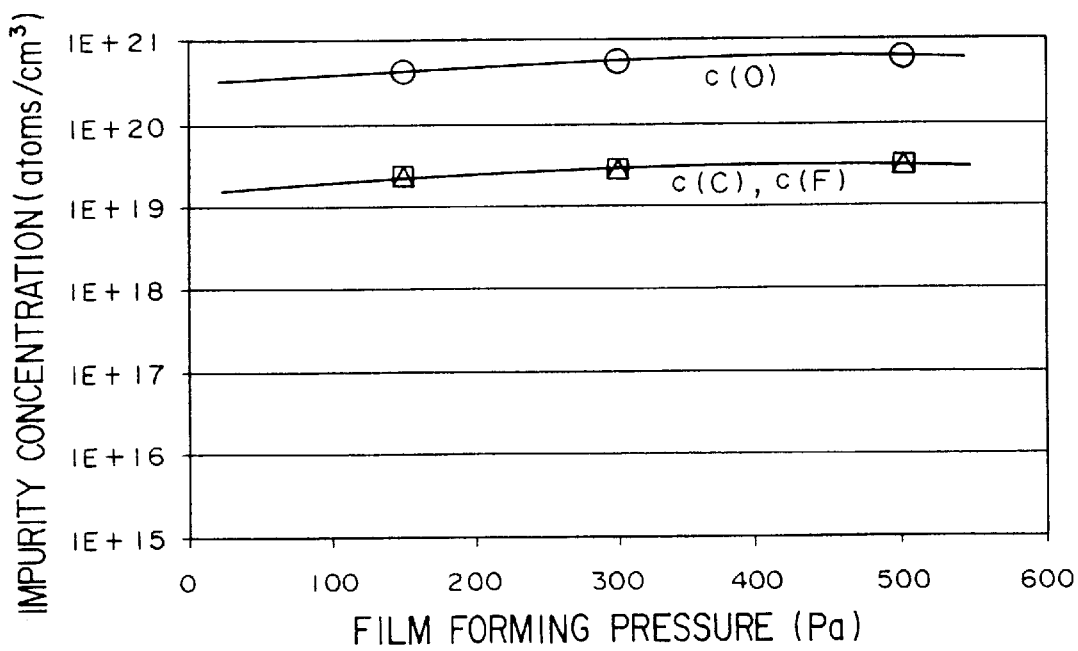

FIGS. 4A and 4B are a cross sectional view illustrating a main process of forming samples and a graph showing the characteristics of samples.

As shown in FIG. 4A, on a p-type Si substrate 10 with a silicon oxide film 1 about 10 nm in thickness formed on the surface thereof, a TiN barrier layer 2 about 50 nm in thickness and a Cu layer 3 having a thickness of 250 to 300 nm were formed by CVD.

A resistance heating CVD system with a resistance heater RH shown in FIG. 4A was used for CVD and the silicon substrate 10 was placed on a susceptor SA made of aluminum nitride.

Ti[N(CH$_3$)$_2$]$_4$ (TDMAT), Ti[N(C$_2$H$_5$)]$_4$ (TDEAT) and the like were used as the source material of TiN. In order to regulate the amount of nitrogen, ammonium was optionally added. Copper (I) trimethylvinylsilyl-hexafluoroacethylacetonato (Cu (hfac) tmvs) was used as the source material of Cu. Trimethylvinylsilane (tmvs) and hexafluoroacetylacetone dihydrate (Hhfac.2H$_2$O, HDH) were added as reaction regulator.

The conditions of forming the Cu layer were a film forming temperature of 220° C., a film forming pressure of 500 Pa, a carrier gas of H$_2$ (500 sccm), a Cu material of Cu (hfac) tmvs+tmvs (2.5 wt. %)+Hhfac.2H$_2$O (0.4 wt. %), and a source material supply rate of 1.0 g/min.

After the TiN layer 2 and Cu layer 3 were formed on the silicon nitride film 1 under the above conditions, a Cu layer was formed to a thickness of about 1 μm by electroplating. An adhesion force test was performed for the Cu layer by using tapes. With this adhesion force test, Cu layers were peeled off. If wiring is formed by using such a Cu layer having a low adhesion force, the finished wiring is very low in reliability.

Samples were also formed at the CVD pressures of 300 Pa and 150 Pa when the Cu seed layer was deposited. Also in these samples, Cu layers were peeled off during adhesion force tests.

A purity of each Cu layer formed by CVD was measured with a secondary ion mass spectrometer (SIMS). Most possible elements detectable as impurities are C, F, O and H, which are contained in the source material. Of these elements, the concentrations of C, F and O were measured.

FIG. 4B is a graph showing the concentrations of O, C and F as a function of the film forming pressure. The abscissa represents a film forming pressure in the unit of Pa in linear scale, and the ordinate represents an impurity concentration in the unit of atoms/cm$^3$ in logarithmic scale. A curve c(O) indicates an impurity concentration of O, and curves c(C) and c(F) indicate impurity concentrations of C and F, respectively. The impurity concentrations of C and F were the same. Even if the film forming pressure was reduced, the impurity concentrations of O, C and F did not change greatly although they reduced a little, the impurity concentration of O being maintained higher than $1 \times 10^{20}$ cm$^{-3}$ and those of C and F higher than $1 \times 10^{19}$ cm$^{-3}$.

When the Cu film was formed by sputtering, the impurity concentrations of C, O and F were lower than the measurement limits (O: $5 \times 10^{18}$ atoms/cm$^3$, C: $7 \times 10^{17}$ atoms/cm$^3$, F: $1 \times 10^{16}$ atoms/cm$^3$). This result matches the fact that the source material does not contain these impurities.

It can be presumed that a large amount of impurities left in the seed layer may cause an increased resistance of Cu wiring, a lowered adhesion force, and a degraded migration resistance. It is desired to reduce impurities in the Cu seed layer.

Figure 1A:
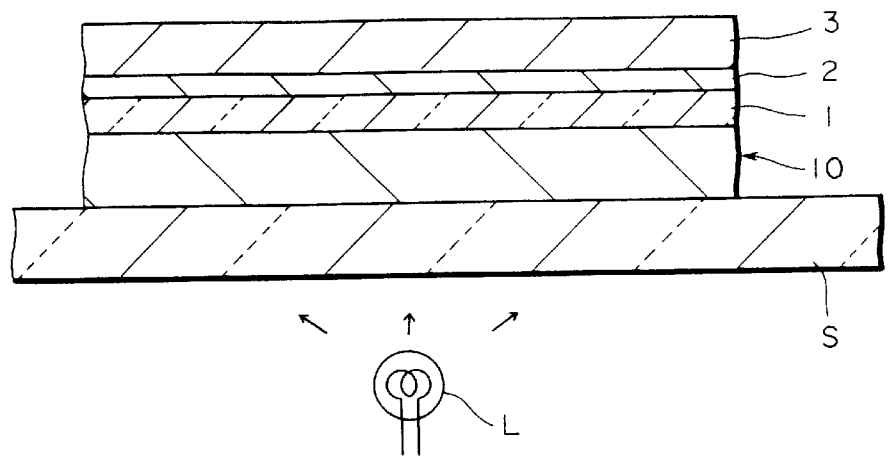
FIGS. 1A and 1B are a cross sectional view illustrating a process of forming samples used by the experiments by the present inventors and a graph showing the impurity concentrations of samples.
Figure 1B:
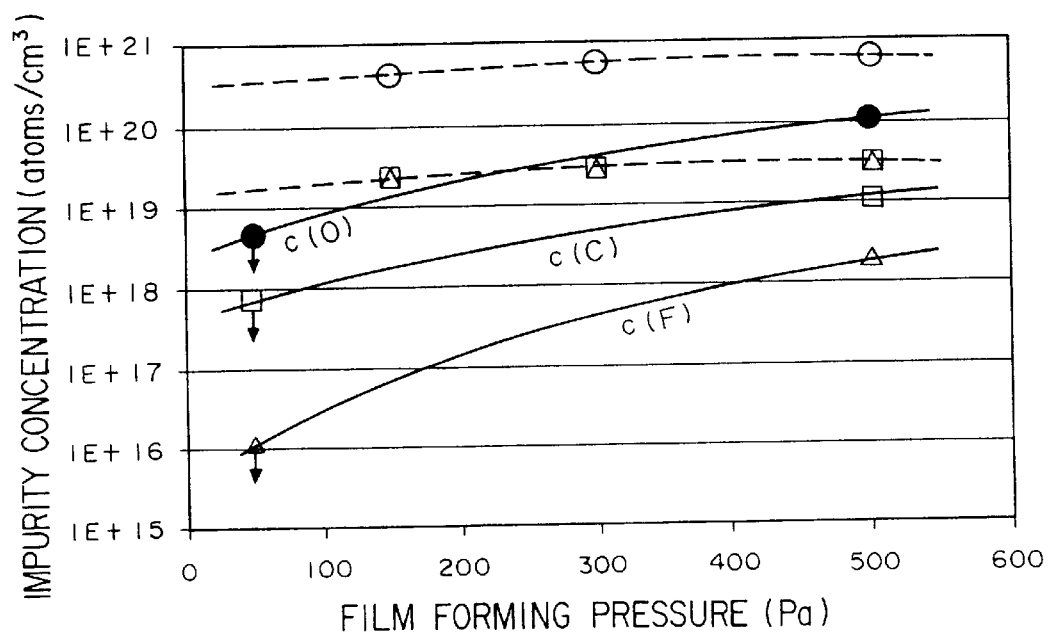

FIGS. 1A and 1B are a cross sectional view illustrating a process of forming Cu wiring according to an embodiment of the invention and a graph showing the characteristics of Cu wiring formed by the embodiment method.

As shown in FIG. 1A, a lamp heating CVD system used has a halogen lamp L disposed under a susceptor S made of quartz.

Figure 2A:
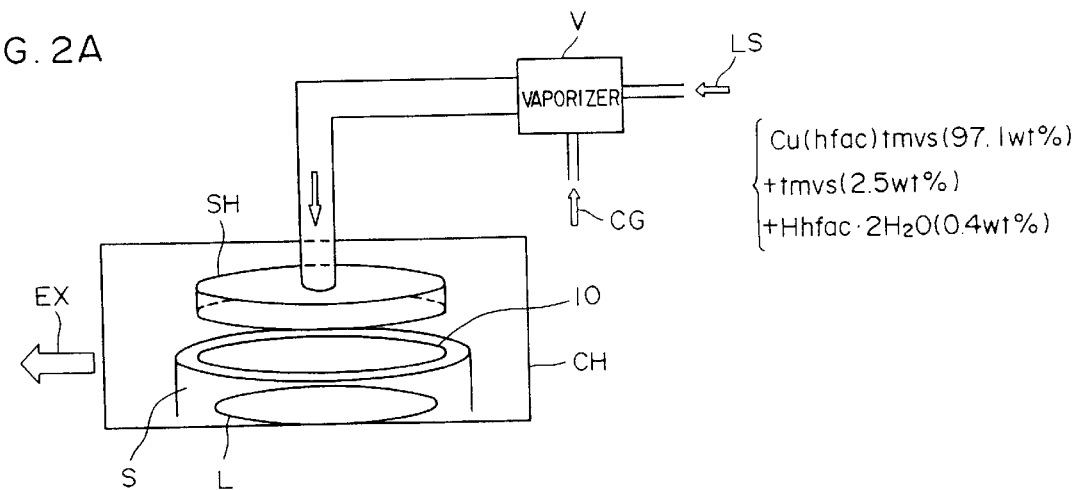
FIGS. 2A to 2D are a schematic diagram showing the structure of a lamp heating CVD system, a diagram showing a molecular formula of organic copper compound used as Cu source material, and schematic cross sectional views showing modifications of a lamp heating CVD system.

FIG. 2A is a schematic diagram showing the overall structure of a lamp heating CVD system. Under a susceptor S made of quartz disposed in a chamber CH, a halogen lamp L is placed. An Si substrate 10 is placed on the quartz susceptor S. A shower head SH is disposed over the Si substrate to blow source gas over the whole surface of the substrate 10. Liquid source LS is bubbled or vaporized by carrier gas CG (H$_2$ gas) in a carburetor or vaporizer V and supplied to the shower head SH as source gas. TDMAT and TDEAT are provided as the TiN source material, and a mixed liquid material of Cu (hfac) tmvs (97.1 wt. %)+tmvs (2.5 wt. %)+Hhfac.2H$_2$O (0.4 wt. %) is provided as the Cu source material. A growth chamber is surrounded by the chamber CH, and the source gas after contribution to film growth is exhausted to the outside of the chamber CH via an exhaust port EX.

Figure 2B:
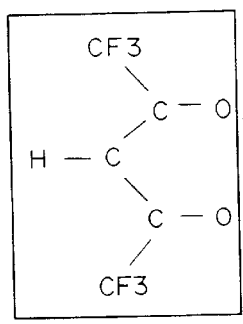
Figure 2B:
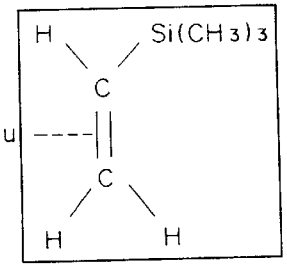

Organic copper compound Cu (hfac) tmvs used as the Cu source material is expressed by the molecular formula and molecular structure as shown in FIG. 2B.

As shown in FIG. 1A, on the surface of the p-type silicon substrate 10, a silicon nitride film 1 was formed to a thickness of about 100 nm. This silicon substrate 10 was placed on the susceptor S, and CVD was performed by heating the substrate 10 with the halogen lamp L and flowing the source gas.

First, a TiN layer 2 was grown to a thickness of about 50 nm by using source gas such as TDMAT and TDEAT. Thereafter, a mixed liquid of Cu (hfac) tmvs (97.1 wt. %), tmvs (2.5 wt. %), and Hhfac.2H$_2$O (0.4 wt. %) was vaporized by H$_2$ gas in the vaporizer V to form source gas. A Cu layer having a thickness of about 250 to 300 nm was formed by CVD on the TiN layer 2 under the conditions of a substrate temperature of about 220° C., a source material supply amount of 1.0 g/min and a carrier H$_2$ flow rate of 500 sccm. At the film growth pressure of 500 Pa, the impurity concentrations of O, C and F in the deposited Cu film were $1 \times 10^{20}$ atoms/cm$^3$, $1 \times 10^{19}$ atoms/cm$^3$, and $2 \times 10^{18}$ atoms/cm$^3$, respectively.

At the reduced film growth pressure of 50 Pa and under the same other conditions, the impurity concentrations of O, C and F in the deposited Cu film were lower than $5 \times 10^{18}$ atoms/cm$^3$, $7 \times 10^{17}$ atoms/cm$^3$, and $1 \times 10^{16}$ atoms/cm$^3$, respectively, which are the detection limits. These measurement results are shown in FIG. 1B. The impurity concentrations at the film forming pressure of 50 Pa are lower than the detection limits and have the values lower than those indicated by curves, as indicated by arrows. Impurity concentrations of O, C and F can be easily suppressed below $1 \times 10^{19}$ atoms/cm$^3$. It will be desirable to conduct CVD of Cu with a growth pressure of 500 Pa or lower, preferably 100 Pa or lower, and more preferably 6 Pa or lower, for reducing the impurity concentration.

For the purposes of comparison, the impurity concentrations of Cu films formed by resistance heating CVD are also shown in the graph of FIG. 1B. As compared with resistance heating, the impurity concentrations of Cu films formed by lamp heating are reduced at the same pressure. It can be presumed that as the film forming pressure is lowered, a difference of the impurity concentrations between resistance heating and lamp heating becomes large.

After a Cu layer was formed by electroplating to a thickness of about 1 μm on the seed Cu layer formed by lamp heating, an adhesion force test by tapes was conducted. With the adhesion force test, the Cu layers were not peeled off.

As described above, Cu films having a low impurity concentration were able to be formed by lamp heating CVD.

It can be judged that the Cu film formed by lamp heating CVD provides a high adhesion force relative to peel-off and is more suitable for practical use.

The reason for a lowered impurity concentration and an increased adhesion force obtained when a Cu film is formed by lamp heating CVD is not known to date. During resistance heating, the susceptor is first heated and then the Si substrate is gradually heated through thermal conduction, whereas during lamp heating, the Si substrate is heated directly and rapidly. The lowered impurity concentration and increased adhesion force may be ascribed first to this difference of heating methods. However, the reason for a different impurity concentration by the heating method is not clear to date. An Si substrate may be lamp-heated not only from the bottom surface of the substrate but also from the front surface.

The lowered impurity concentration and increased adhesion force may be ascribed next to some chemical reaction to be caused by lamp light radiated to source gas, some chemical reaction to be caused by lamp light reflected and radiated to the substrate surface, or the like.

In the latter case, heating the substrate by lamp light is not necessarily required, but the lamp light may be applied to supplied source gas or lamp light capable of chemical reaction may be applied to the substrate surface.

In the above experiments, Cu (hfac) tmvs was used as the Cu source material. In addition to this organic copper compound, Cu (hfac).L having similar characteristics is expected to be usable, where L is (1) 1.5-cyclooctadiene, (2) bis(trimethylsilyl)acetylene, (3) 2-butyne, (4) triethoxyvinylsilane, and (5) trimethylallylsilane. Also for these materials, as additive, atom groups not containing Cu of these organic copper compounds or materials containing these atom groups are expected to be usable.

Barrier layer is preferably formed of refractory metal such as Ti, Ta, W, Mo, Zr or their nitride. If the barrier layer is formed by CVD, a TiN layer, a WN layer, or a ZrN layer may be used as the barrier layer. A TaN layer is also expected to be usable.

The lamp heating CVD system used for the experiments uses one halogen lamp as a light source.

Figure 2C:
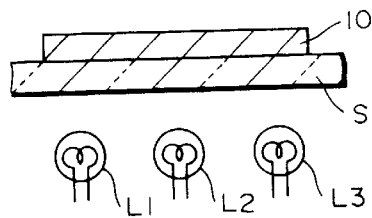

As shown in FIG. 2C, it is obvious that similar results will be obtained by using a plurality of lamps L1, L2 and L3.

Figure 2D:
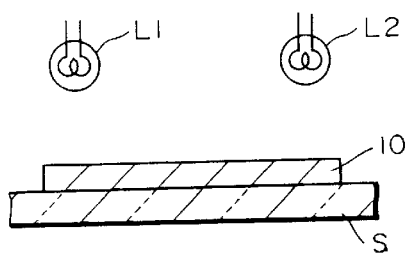

As shown in FIG. 2D, it is also expected that similar results will be obtained by disposing a lamp above a substrate 10.

Similar results are expected not only by using a lamp only but also by radiating light to source gas while resistance heating is performed.

The above-described preparatory experiments were conducted by forming a silicon oxide film, a barrier film and a seed layer on an Si substrate having a flat surface. A semiconductor device having a multi-layer structure has various geometrical structures in or on the surface layer of a semiconductor substrate.

FIGS. 3A to 3E are cross sectional views illustrating the manufacture processes for Cu damascene wiring of a semiconductor device.

Figure 3A:
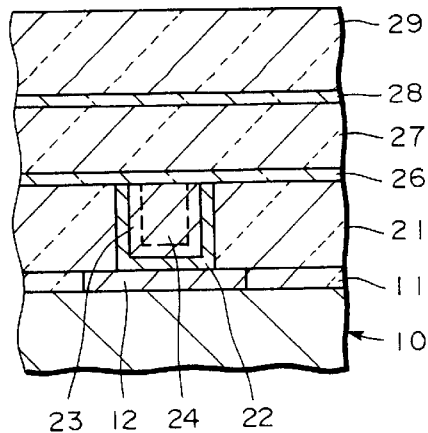
FIGS. 3A to 3E are cross sectional views illustrating the precesses of forming wiring.

As shown in FIG. 3A, on the surface of an Si substrate 10 having a conductive region 12 and an isolation region 11, an insulating layer 21 is formed and a damascene wiring trench is formed. After a barrier layer 22 and a Cu seed layer 23 are formed on the inner surface of the trench and the upper surface of the insulating layer 21, a Cu layer 24 is formed on the surface of the seed layer 23 by electroplating. The Cu seed layer is formed by the method described earlier.

Thereafter, the barrier layer, seed layer and Cu wiring layer deposited on the surface of the insulating layer 21 are removed by CMP. For example, if the conductive region 12 is the source/drain regions of a MOS transistor, damascene wiring for the source/drain regions is formed. This damascene wiring is, for example, a lead plug.

Figure 3D:
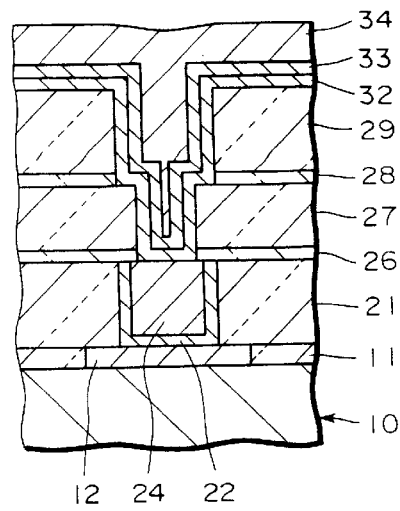
Figure 3B:
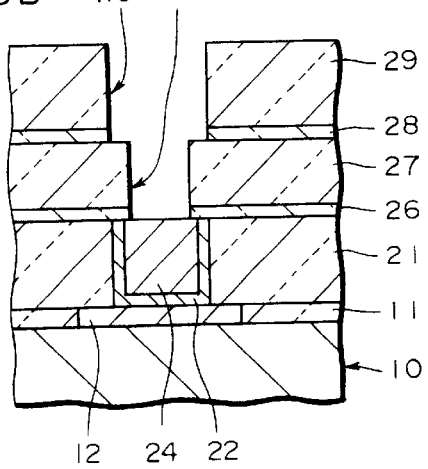
Figure 3E:
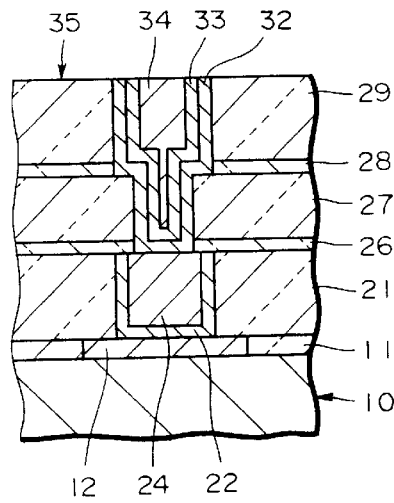
Figure 3C:
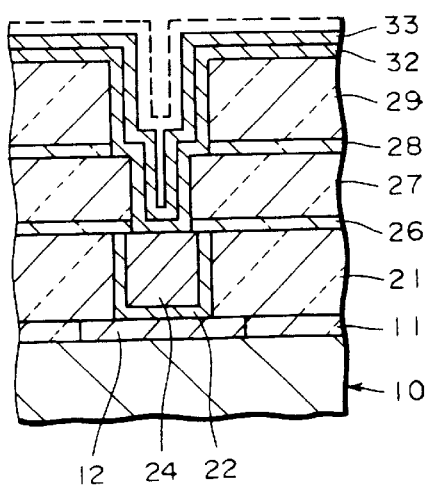
Figure 3F:
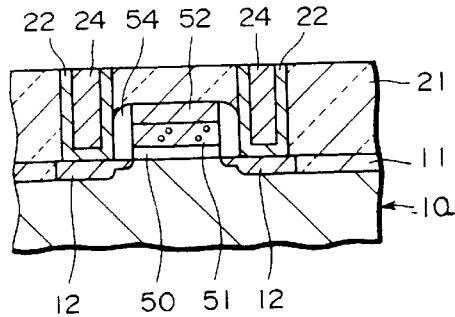
FIG. 3F is a cross sectional view showing the structure of a MOS transistor.

FIG. 3F shows the structure of a MOS transistor. An insulated gate electrode structure is formed on a p-type region of a silicon substrate 10 having a shallow trench isolation region 11. The insulated gate electrode structure includes a gate oxide film 50, a polysilicon film 51 and a silicide film 52. The side walls of the gate electrodes have side spacers 54 of silicon oxide and/or silicon nitride. Source/drain regions 12 are formed on both sides of the insulated gate electrode by ion implantation. Via holes are formed through an insulating layer 21 covering the gate electrode. Damascene plugs, each made of a barrier film 22 and copper region 24, are embedded in the via holes.

After the lower wiring layer is formed, on the surface of the first insulating layer 21, a first etch stopper layer 26, a second inter-level insulating film 27, a second etch stopper layer 28 and a third inter-level insulating film 29 are formed. The etch stopper layers 26 and 28 may be SiN layers having a thickness of about 50 nm. The inter-level insulating layers 27 and 29 may be a CVD-$SiO_2$ film, a silicon oxide film added with P, B and P, F or the like, or other films.

As shown in FIG. 3B, by using a resist mask, a via hole VH is formed through the third inter-level insulating film 29, second etch stopper layer 28 and second inter-level insulating film 27. The resist mask is thereafter removed.

After a new resist mask is formed, a wiring trench or groove WG is formed through the third inter-level insulating layer 29. The etch stopper layers 26 and 28 exposed on the bottoms of the via hole VH and wiring trench WG are etched and removed to expose the surface of the lower wiring plug 24. The resist mask used is removed before or after the etch stopper layers are etched.

As shown in FIG. 3C, a barrier layer 32 and seed layer 33 are formed on the inner surfaces of the via hole VH and wiring trench WG and on the upper surface of the third inter-level insulating film 29. For example, the barrier layer 32 is a TiN layer made by metal organic CVD and the seed layer 33 is a Cu layer formed by CVD described earlier. The film deposition amount may be increased to bury the via hole VH as indicated by a broken line.

As shown in FIG. 3D, a Cu layer 34 is formed on the seed layer 33 by electroplating, burying the via hole VH and wiring trench WG.

As shown in FIG. 3E, the Cu wiring layer 34, Cu seed layer 33 and TiN barrier layer 32 deposited on the upper surface of the third inter-level insulating film 29 are etched and removed to form a flat surface 35.

It is obvious to those skilled in the art that on this flat surface 35, an etch stopper layer and an inter-level insulating film are repetitively formed to form similar damascene wiring.

As an integration degree becomes high, the diameter of a via hole becomes small. In such a case, the via hole VH may be fully buried or embedded with the seed layer 33. Dual damascene wiring may be formed only by CVD without using electroplating. In this case, the seed layer 33 and wiring layer 34 shown in FIG. 3E may be replaced by a single Cu layer.

The present invention has been described in connection with the preferred embodiments. The invention is not limited only to the above embodiments. It will be apparent to those skilled in the art that various modifications, improvements, combinations, and the like can be made.

What we claim are:

1. A method of manufacturing a semiconductor device comprising the steps of:
    (a) preparing a semiconductor substrate formed with an insulating layer having a wiring recess on a front surface; and
    (b) irradiating halogen lamp light while depositing a copper layer by chemical vapor deposition on the front surface of the semiconductor substrate including an inner surface of the wiring recess,
        wherein said step (b) provides said copper layer containing fewer impurities than that of a copper layer formed by resistance heating CVD.

2. A method of manufacturing a semiconductor device according to claim 1, wherein said step (b) is performed by applying the halogen lamp light from a top side of the semiconductor substrate.

3. A method of manufacturing a semiconductor device according to claim 1, wherein said step (b) is performed by supplying source gas from a shower head disposed facing the semiconductor substrate.

4. A method of manufacturing a semiconductor device according to claim 1, wherein said step (b) is performed by raising a temperature of the semiconductor substrate to a film forming temperature by applying the halogen lamp light.

5. A method of manufacturing a semiconductor device according to claim 1, wherein said step (b) uses organic copper compound containing fluorine, oxygen and carbon, as copper source material.

6. A method of manufacturing a semiconductor device according to claim 5, wherein the organic copper compound is Cu (hfac).L where L is at least one of trimethylvinylsilyl (tmvs), 1,5-cyclooctadiene, bis(trimethylsilyl)acetylene, 2-butyne, triethoxyvinylsilane, and trimethylallylsilane.

7. A method of manufacturing a semiconductor device according to claim 6, wherein the organic copper compound is Cu (hfac) tmvs.

8. A method of manufacturing a semiconductor device according to claim 5, wherein said step (b) uses material containing some of atom groups of the organic copper compound as additive gas, in addition to the organic copper compound.

9. A method of manufacturing a semiconductor device according to claim 1, wherein said step (a) includes a step of forming an underlying layer on the semiconductor substrate having the wiring recess by chemical vapor deposition, the underlying layer being made of refractory metal or its nitride.

10. A method of manufacturing a semiconductor device according to claim 1, wherein said step (b) is performed at a film forming pressure of 500 Pa or lower.

11. A method of manufacturing a semiconductor device according to claim 1, wherein said step (b) is performed at a film forming pressure of 100 Pa or lower.

12. A method of manufacturing a semiconductor device according to claim 1, wherein said step (b) is performed at a film forming pressure of 6 Pa or lower.

13. A method of manufacturing a semiconductor device according to claim 1, wherein said step (b) uses $H_2$ as carrier gas.

14. A method of manufacturing a semiconductor device according to claim 1, wherein the wiring recess includes a via hole and a wiring trench, and said step (b) deposits the copper layer essentially consisting of copper in the via hole and wiring trench.

15. A method of manufacturing a semiconductor device according to claim 14, wherein said step (b) buries the via hole, or the via hole and wiring trench, with the copper layer.

16. A method of manufacturing a semiconductor device comprising the steps of:
    (a) preparing a semiconductor substrate formed with an insulating layer having a wiring recess on a front surface; and
    (b) depositing a conductive layer by chemical vapor deposition on the front surface of the semiconductor substrate including an inner surface of the wiring recess, while lamp light is applied to the semiconductor substrate, the conductive layer consisting essentially of copper,
        wherein said step (b) is performed by placing the semiconductor substrate on a susceptor made of material transparent to the lamp light and applying the lamp light from a rear surface of the semiconductor substrate through said susceptor.

17. A method of manufacturing a semiconductor device according to claim 16, wherein the susceptor is made of quartz.

18. A method of manufacturing a semiconductor device comprising the steps of:
    (a) preparing a semiconductor substrate formed with an insulating layer having a wiring recess on a front surface; and
    (b) depositing a conductive layer by chemical vapor deposition using an organic source on the insulating layer including an inner surface of the wiring recess, while lamp light from a high temperature filament is applied to a rear surface of the semiconductor substrate, the conductive layer consisting essentially of copper.

19. A method of making a semiconductor device according to claim 18, wherein said step (b) uses an organic copper compound as copper source material, and wherein the organic copper compound is Cu (hfac) L, where L is at least one of trimethlyvinlysilyl (tmvs), 1.5-cyclooctadiene, bis (trimethylsilyl (asetylene, 2-butyne, triethoxyvinylsilane, and trimethylallylsilane.

20. A method of manufacturing a semiconductor device according to claim 18, wherein the organic copper compound is (cu (Hfac) tmvs.

21. A method of manufacturing a semiconductor device according to claim 18, wherein said step (b) uses an organic copper compound containing fluorine, oxygen and carbon as copper source material, and also uses material containing some atom groups of the organic copper compound as an additive gas, in addition to the organic copper compound.

22. A method of manufacturing a semiconductor device comprising the steps of:
    (a) preparing a semiconductor substrate formed with an insulating layer having a wiring recess on a front surface; and
    (b) introducing a source gas of copper into a reaction chamber at a pressure equal to or less than 100 Pa, and irradiating halogen lamp light while performing chemical vapor deposition of a copper layer on the front surface of the semiconductor substrate including an inner surface of the wiring recess,
        wherein said step (b) produces a copper layer containing fewer impurities than that of a copper layer formed by resistance heating CVD.

23. A method of manufacturing a semiconductor device according to claim 22, wherein said step (b) is performed by supplying source gas from a shower head disposed facing the front surface of the semiconductor substrate.

24. A method of manufacturing a semiconductor device according to claim 22, wherein said step (b) is performed by raising a temperature of the semiconductor substrate to a film forming temperature by applying the lamp light.

25. A method of manufacturing a semiconductor device according to claim 22, wherein said step (b) uses organic copper compound containing fluorine, oxygen and carbon, as copper source material.

26. A method of manufacturing a semiconductor device according to claim 25, wherein the organic copper compound is Cu (hfac).L, where L is at least one of trimethylvinylsilyl (tmvs), 1.5-cyclooctadiene, bis(trimethylsilyl) acetylene, 2-butyne, triethoxyvinylsilane, and trimethylallylsilane.

27. A method of manufacturing a semiconductor device according to claim 26, wherein the organic copper compound is Cu (hfac) tmvs.

28. A method of manufacturing a semiconductor device according to claim 25, wherein said step (b) uses material containing some of atom groups of the organic copper compound as additive gas, in addition to the organic copper compound.

29. A method of manufacturing a semiconductor device according to claim 22, wherein said step (a) includes a step of forming an underlying layer on the semiconductor substrate having the wiring recess by chemical vapor deposition, the underlying layer being made of refractory metal or its nitride.

30. A method of manufacturing a semiconductor device according to claim 22, wherein said step (b) is performed at a film forming pressure of 6 Pa or lower.

31. A method of manufacturing a semiconductor device according to claim 22, wherein said step (b) uses $H_2$ as carrier gas.

32. A method of manufacturing a semiconductor device according to claim 22, wherein the wiring recess includes a via hole and a wiring trench, and said step (b) deposits the copper layer in the via hole and wiring trench.

33. A method of manufacturing a semiconductor device according to claim 32, wherein said step (b) buries the via hole, or the via hole and wiring trench, with the copper layer.

* * * * *